(12) United States Patent
Nakamura et al.

(10) Patent No.: US 8,218,297 B2
(45) Date of Patent: Jul. 10, 2012

(54) ELECTRONIC CIRCUIT DEVICE

(75) Inventors: Tadashi Nakamura, Hoi-gun (JP); Takeo Tsuzuki, Toyota (JP)

(73) Assignee: Denso Corporation, Kariya (JP)

( * ) Notice: Subject to any disclaimer, the term of this patent is extended or adjusted under 35 U.S.C. 154(b) by 490 days.

(21) Appl. No.: 12/564,306

(22) Filed: Sep. 22, 2009

(65) Prior Publication Data

US 2010/0079934 A1    Apr. 1, 2010

(30) Foreign Application Priority Data

Sep. 26, 2008    (JP) .................................. 2008-248861

(51) Int. Cl.
*H05K 5/06*    (2006.01)

(52) U.S. Cl. .................... 361/679.01; 361/752; 174/522; 367/188

(58) Field of Classification Search ............. 361/679.01, 361/592
See application file for complete search history.

(56) References Cited

U.S. PATENT DOCUMENTS

| | | | | |
|---|---|---|---|---|
| 4,594,644 A * | 6/1986 | Painter | ........................... | 361/807 |
| 6,184,464 B1 * | 2/2001 | Liptak et al. | ................... | 174/521 |
| 6,532,193 B1 * | 3/2003 | Fehse et al. | ................... | 367/140 |
| 6,665,192 B2 * | 12/2003 | Wimberger Friedl et al. | ............................. | 361/752 |
| 6,759,950 B2 * | 7/2004 | Nishimoto et al. | ........... | 340/436 |
| 7,560,676 B2 * | 7/2009 | Moon | ......................... | 250/203.4 |
| 7,728,486 B2 * | 6/2010 | Matsuo | .......................... | 310/322 |
| 7,737,609 B2 * | 6/2010 | Murata et al. | .................. | 310/348 |
| 7,897,234 B2 * | 3/2011 | Selverian et al. | ............... | 428/76 |
| 2003/0087448 A1 * | 5/2003 | Abe et al. | .......................... | 436/73 |
| 2007/0025878 A1 * | 2/2007 | Abe et al. | ..................... | 422/68.1 |
| 2007/0237031 A1 * | 10/2007 | Kawashima et al. | ......... | 367/140 |
| 2007/0277615 A1 * | 12/2007 | Triebl et al. | ..................... | 73/649 |
| 2009/0301205 A1 * | 12/2009 | Reiche | ............................ | 73/632 |
| 2011/0088479 A1 * | 4/2011 | Urase et al. | ..................... | 73/649 |

FOREIGN PATENT DOCUMENTS

| | | |
|---|---|---|
| JP | 2002-343907 | 11/2002 |
| JP | 2009-212305 | 9/2009 |

* cited by examiner

*Primary Examiner* — Anthony Q Edwards
(74) *Attorney, Agent, or Firm* — Nixon & Vanderhye PC

(57) ABSTRACT

An electronic circuit device includes a case and a cover between which a space is defined, electronic circuit parts arranged in the space, and a sealant to seal the electronic circuit parts. The case has a bottom face, a side wall, and an opening face opposing to the bottom face. The cover is located inside of the side wall so as to close the opening face of the case. The cover has a filling port through which the sealant is filled. The cover has a top face located approximately equal to an end face of the side wall, or adjacent to the bottom face relative to the end face of the side wall.

8 Claims, 5 Drawing Sheets

ELECTRONIC CIRCUIT DEVICE

CROSS REFERENCE TO RELATED APPLICATION

This application is based on Japanese Patent Application No. 2008-248861 filed on Sep. 26, 2008, the disclosure of which is incorporated herein by reference in its entirety.

BACKGROUND OF THE INVENTION

1. Field of the Invention

The present invention relates to an electronic circuit device.

2. Description of Related Art

JP-A-2002-343907 discloses an electronic circuit device. The electronic circuit device includes a case accommodating electronic circuit parts, and the electronic circuit parts are sealed by sealant so as to be protected.

Further, another electronic circuit device includes a case and a cover to cover an opening of the case. Electronic circuit parts are arranged in a space constructed by the case and the cover. The space is filled with sealant such as liquid resin. When the liquid resin is hardened, a viscosity of the liquid resin may become low, and the liquid resin having the low viscosity may leak from a slight side clearance between the case and the cover. In this case, the leaking liquid resin may adhere onto an outer wall of the case or the cover.

SUMMARY OF THE INVENTION

In view of the foregoing and other problems, it is an object of the present invention to provide an electronic circuit device.

According to an example of the present invention, an electronic circuit device includes a case and a cover between which a space is defined. A plurality of electronic circuit parts is arranged in the space, and a sealant seals the plurality of electronic circuit parts. The case has a bottom face, a side wall, and an opening face opposing to the bottom face. The cover is located inside of the side wall so as to close the opening face of the case. The cover has a filling port through which the sealant is filled in the space. The cover has a top face located to be equal to an end face of the side wall, or is located adjacent to the bottom face relative to the end face of the side wall.

Accordingly, leak of the sealant can be restricted.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENT

An electronic circuit device may be an ultrasonic sensor 100 to detect an obstacle around a vehicle, for example.

Figure 1:
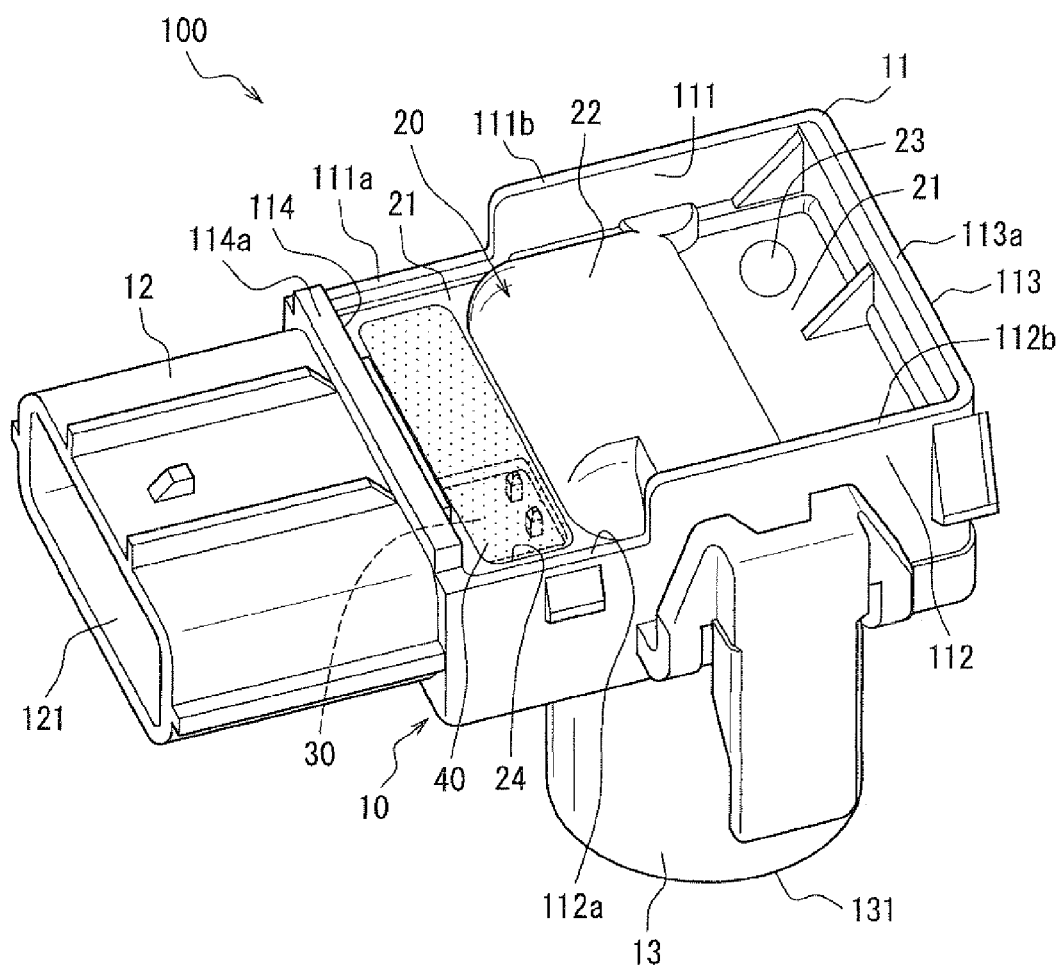
FIG. 1 is a schematic perspective view illustrating an ultrasonic sensor according to an embodiment of the present invention.
Figure 2:
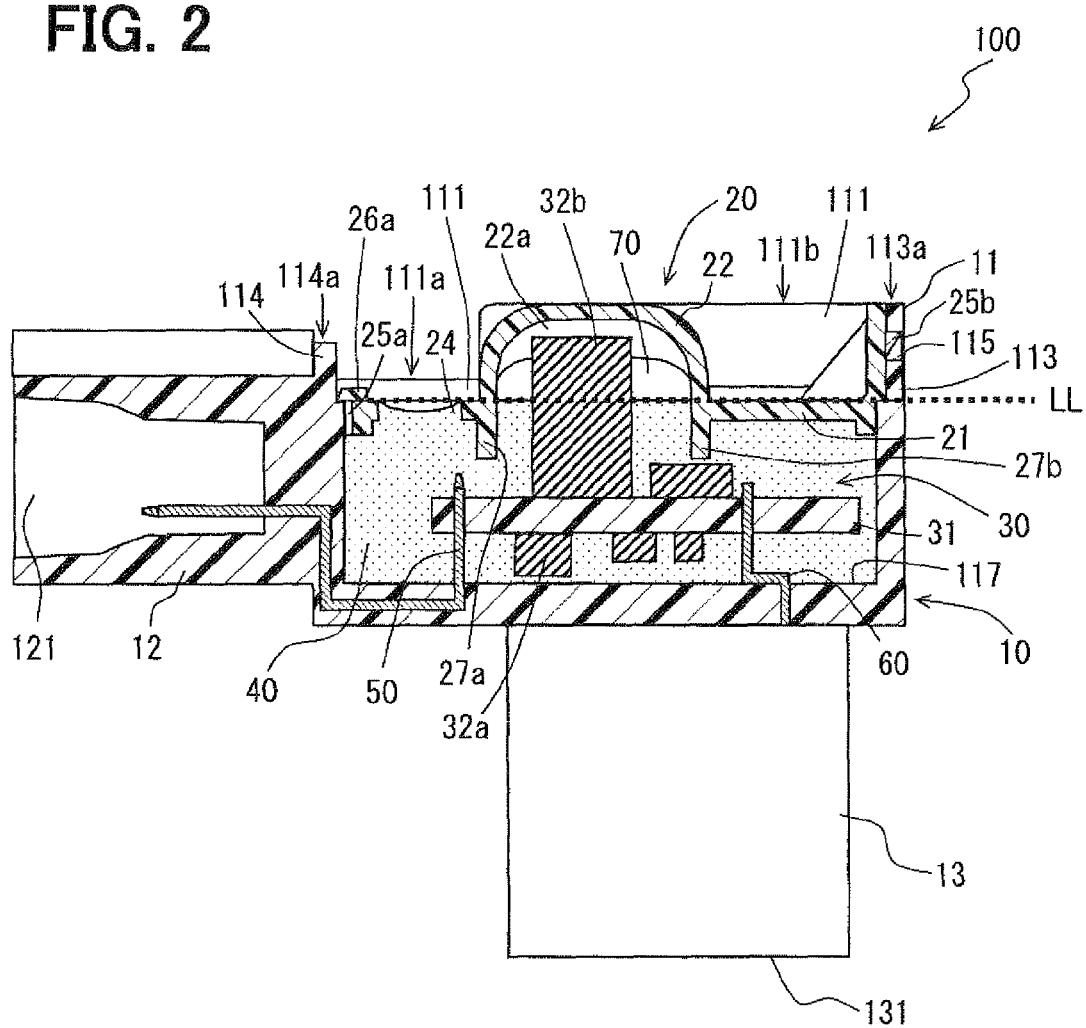
FIG. 2 is a schematic cross-sectional view illustrating the ultrasonic sensor.

As shown in FIG. 1, the ultrasonic sensor 100 includes a case 10 and a cover 20. As shown in FIG. 2, an electronic circuit 30 is arranged in a space defined by the case 10 and the cover 20. A sealant 40 such as urethane resin protects the electronic circuit 30 from vibration, water or dust, for example.

Figure 7A:
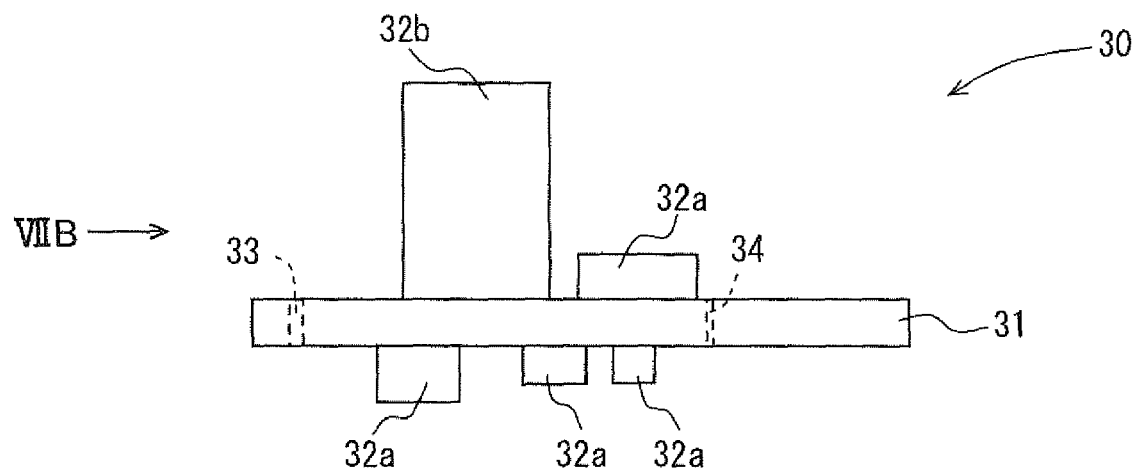
FIG. 7A is a schematic side view illustrating an electronic circuit of the ultrasonic sensor.
Figure 7B:
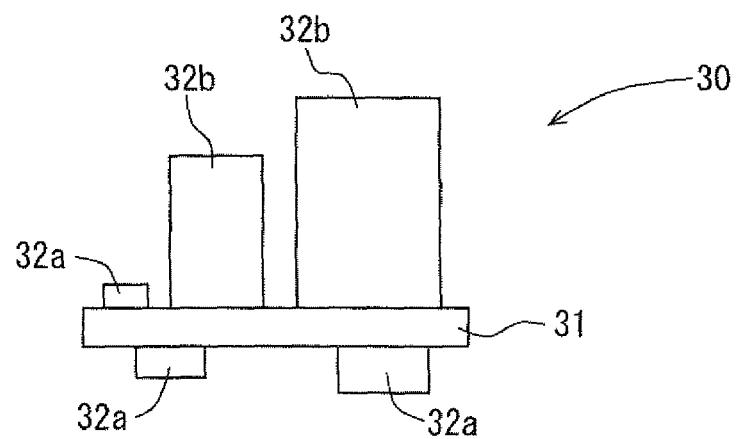
FIG. 7B is a schematic front view illustrating the electronic circuit.

As shown in FIG. 7A, the electronic circuit 30 includes a circuit board 31 having a wiring pattern (not shown) and terminal insertion holes 33, 34. As shown in FIG. 7B, relatively short electronic parts 32a and relatively tall electronic parts 32b are mounted to the circuit board 31. When the electronic circuit 30 is used in the ultrasonic sensor 100, the tall electronic parts 32b are capacitors and coils, for example. Further, the tall electronic parts 32b mounted to the circuit board 31 may have heights different from each other.

As shown in FIG. 2, the electronic circuit 30 is connected to a connector terminal 50 to be electrically connected to an outside circuit. The connector terminal 50 is connected to the electronic circuit 30 by being inserted into the terminal insertion hole 33 of the circuit board 31.

Further, the electronic circuit 30 is connected to a connector terminal 60 to be electrically connected to a piezoelectric element (not shown) to be a detector of the ultrasonic sensor 100. The connector terminal 60 is connected to the electronic circuit 30 by being inserted into the terminal insertion hole 34 of the circuit board 31.

The ultrasonic sensor 100 including the electronic circuit 30 is mounted to a bumper, for example, of the vehicle. The piezoelectric element sends and receives ultrasonic wave so as to detect a distance between the vehicle and the obstacle around the vehicle. The detected distance is output into the outside circuit through the connector terminal 50.

The case 10 is produced by an injection molding using a resin material such as polybutylene terephthalate resin. For example, the case 10 is molded by a mold having plural molding patterns. The case 10 integrally includes a main portion 11, a terminal portion 12, and a detector portion 13. The main portion 11 defines a rectangular space accommodating the electronic circuit 30. The terminal portion 12 has a terminal opening 121 in which the connector terminal 50 of the electronic circuit 30 is arranged. The terminal portion 12 has a shape corresponding to a shape of an opposing connector. For example, the terminal portion 12 has a rectangular tube shape. The detector portion 13 has a cylinder shape in which the piezoelectric element is arranged. An end of the piezoelectric element is exposed from a detecting face 131 of the detector portion 13.

Figure 3:
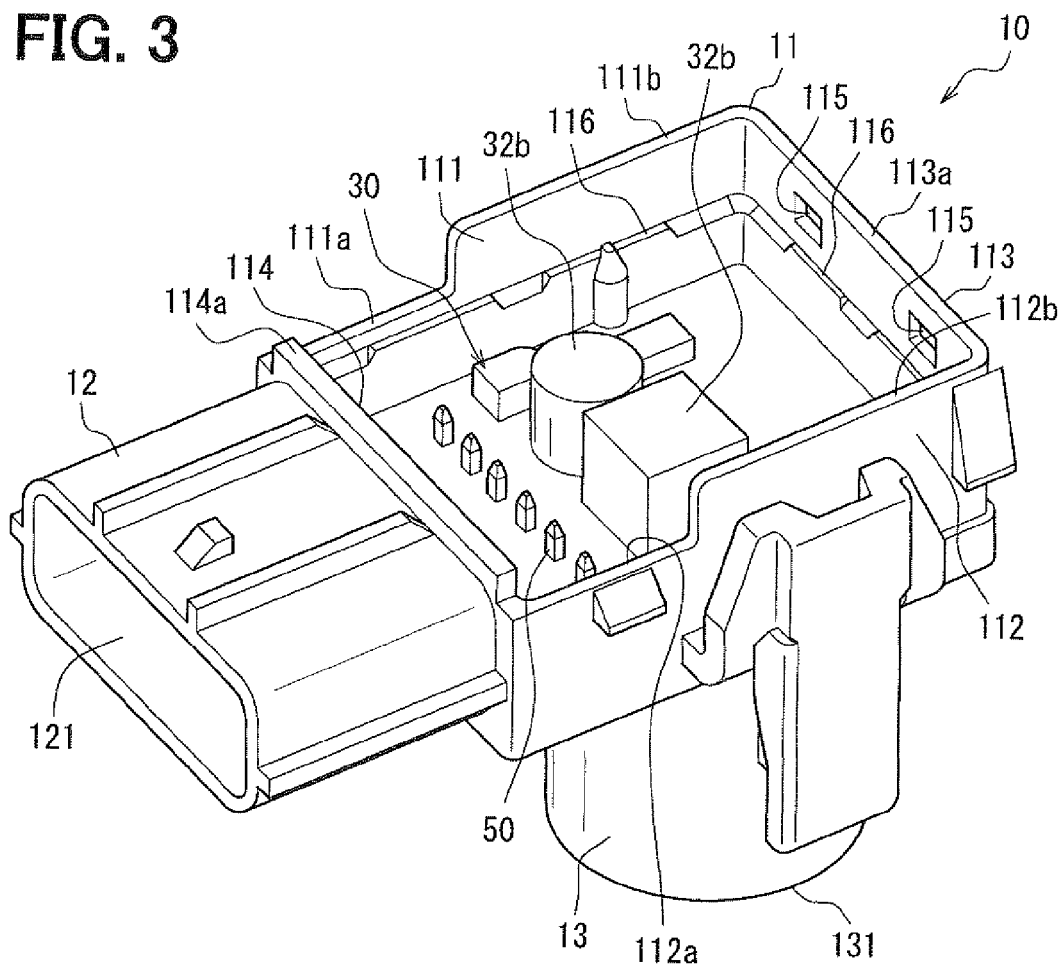
FIG. 3 is a schematic perspective view illustrating the ultrasonic sensor to be covered with a cover.

As shown in FIG. 2 and FIG. 3, the main portion 11 has a bottom face 117 and a side wall 111, 112, 113, 114. The side wall 111, 112, 113, 114 is constructed of four sides, and is approximately perpendicular to the bottom face 117. The electronic circuit 30 may be mounted to the bottom face 117 through a support member (not shown). A face of the main portion 11 opposing to the bottom face 117 is opened. An end face 113a, 114a of the side wall 113, 114 extends in a horizontal condition without a step. In contrast, an end face of the side wall 111, 112 has a step shape. The side wall 111, 112 extends in a longitudinal direction of the electronic circuit 30, and the side wall 113, 114 extends in a direction approximately perpendicular to the side wall 111, 112.

Due to the step shape of the side wall 111, 112, a soldering tool for soldering the circuit board 31 and the connector terminal 50, 60 can be restricted from contacting the side wall 111, 112. The circuit board 31 and the connector terminal 50, 60 are soldered by the soldering tool, in a state that the electronic circuit 30 is disposed in the main portion 11 of the case 10, as shown in FIG. 3.

Because the connector terminal 50 is arranged adjacent to the side wall 111, 112, the soldering tool may contact the side wall 111, 112. Therefore, a height of the side wall 111, 112 adjacent to the connector terminal 50 is partially made short, compared with a height of the side wall 113, such that the soldering tool is restricted from contacting the side wall 111, 112.

That is, the side wall 111, 112 has an end face 111b, 112b approximately equal to the end face 113a of the side wall 113, and an end face 111a, 112a recessed from the end face 111b, 112b toward the bottom face 117.

A step 116 is defined on an inner side of the side wall 111, 112, 113, 114, so as to restrict the cover 20 from falling down. A distance between the step 116 and the end face 111b, 112b, 111a, 112a, 113a, 114a is equal to or longer than a height of the cover 20. Therefore, when the cover 20 is fixed to the case 10, the cover 20 is arranged in the inner side of the side wall 111, 112, 113, 114, and the cover 20 closes the opening of the case 10, in a state that a top face of the cover 20 is located equal to the end face 111a, 112a, 111b, 112b, 113a, 114a or is located closer to the bottom face 117 relative to the end face 111a, 112a, 111b, 112b, 113a, 114a. Further, the side wall 113 has an engaging opening 115 for fixing the cover 20.

Figure 4:
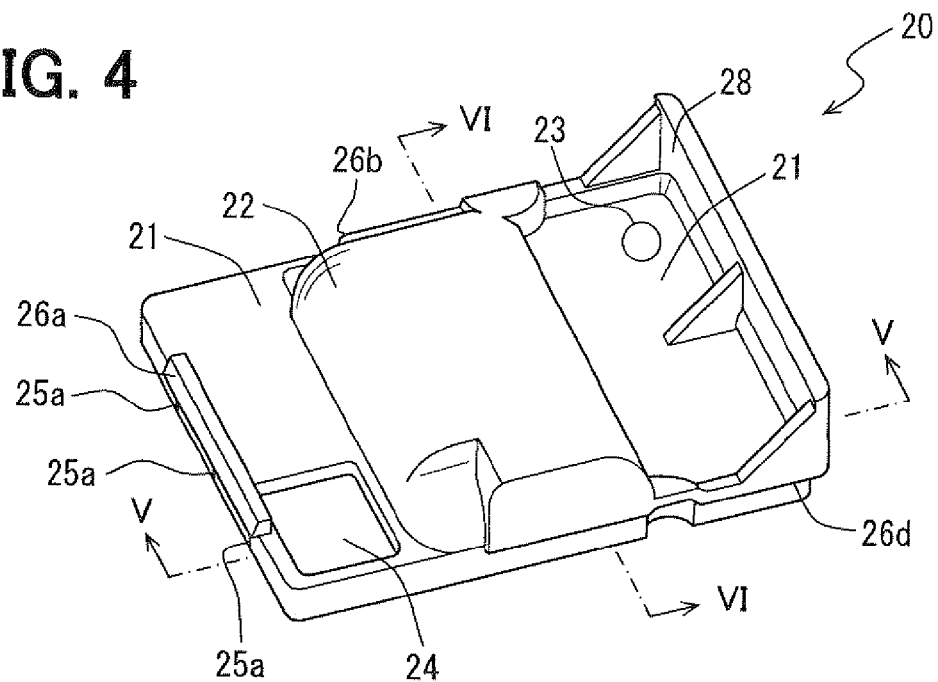
FIG. 4 is a schematic perspective view illustrating the cover.

The cover 20 is produced by an injection molding using a resin material such as polybutylene terephthalate resin. As shown in FIG. 4, the cover 20 has an approximately rectangular shape corresponding to an opening shape of the case 10. The cover 20 has a flat part 21, and a recess part 22. A position of the recess part 22 corresponds to positions of the tall electronic parts 32b. The recess part 22 is recessed from the flat part 21 in a direction separating from the electronic circuit 30.

The flat part 21 has a filling port 24 for filling liquid resin into the space between the case 10 and the cover 20 so as to be the sealant 40, and an air vent hole 23 for making the filling of the liquid resin easier. When the liquid resin is filled through the filling port 24, air can be released out of the space constructed by the case 10 and the cover 20, due to the air vent hole 23.

As shown in FIG. 2, the relatively tall electronic parts 32b are arranged in the recess part 22. The recess part 22 has a height corresponding to a height of the electronic circuit 30. That is, a recess dimension of the recess part 22 corresponds to a height of the tall electronic part 32b mounded to the electronic circuit 30. The tall electronic part 32b arranged in the recess part 22 is partially not sealed by the sealant 40. However, the electronic part 32b arranged in the recess part 22 can be protected, because a space between the filling port 24 and the recess part 22 is sealed by the sealant 40. Thus, a space defined by the case 10 and the cover 20 can be made smaller, such that the amount of the liquid resin used for filling the space defined between the case 10 and the cover 20 can be reduced.

Figure 6:
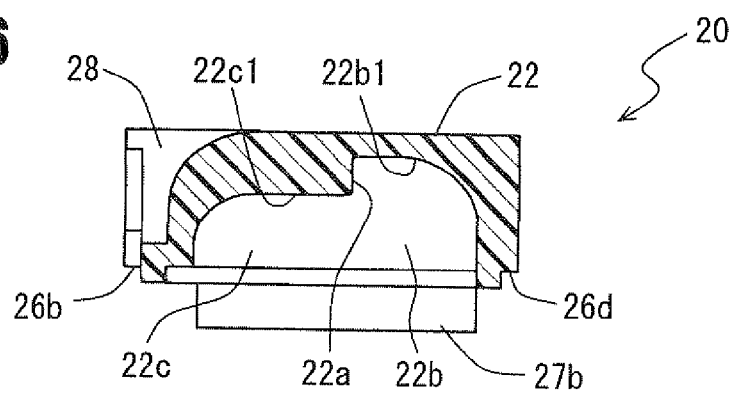
FIG. 6 is a cross-sectional view taken along line VI-VI of FIG. 4.

As shown in FIG. 6, the recess part 22 has a first chamber 22b and a second chamber 22c. A height position is different between a ceiling 22b1 of the first chamber 22b and a ceiling 22c1 of the second chamber 22c. The ceiling 22c1 of the second chamber 22c is located low, compared with the ceiling 22b1 of the first chamber 22b, for example. A wall face 22a is defined between the ceilings 22b1, 22c1 due to a difference of the heights.

As shown in FIG. 2, the sealant 40 is not completely filled in the recess part 22. That is, a space 70 defined between the recess part 22 and the sealant 40 is filled with air. A part of the tall electronic parts 32b is exposed in the space 70. In this case, the air filled in the recess part 22 may expand to affect the electronic circuit 30, because the expansion of air may generate a pressing force relative to the electronic circuit 30, for example, depending on an environment condition in which the ultrasonic sensor 100 is used.

However, due to the ceilings 22b1, 22c1 corresponding to the heights of the tall electronic parts 32b, the space 70 not filled by the sealant 40 can be made smaller. Therefore, the amount of expanded air can be reduced, such that the affecting of the electronic circuit 30 is less possible.

Further, a space surrounded by the case 10 and the cover 20 can be small, because the cover 20 has the flat part 21 and the recess part 22 in which the tall electronic parts 32b are arranged. Therefore, a size of the ultrasonic sensor 100 can be small. Accordingly, the ultrasonic sensor 100 can be easily arranged in a narrow space adjacent to the bumper of the vehicle. If the ultrasonic sensor 100 is exposed from the vehicle, the electronic parts 32a, 32b can be restricted from being wet with water, due to the sealant 40.

Two of the chambers 22b, 22c are defined in the recess part 22 to correspond to the heights of the tall electronic parts 32b. Alternatively, when three or more electronic parts 32b having different heights are mounted to the circuit board 31, three or more chambers may be are defined in the recess part 22 to correspond to the heights of the tall electronic parts 32b. In this case, the amount of expanded air can be reduced, such that the affecting of the electronic circuit 30 is less possible.

Further, when plural electronic parts 32b having different heights are mounted to the circuit board 31, the plural electronic parts 32 may be arranged in a single chamber having a constant ceiling height. In this case, the liquid resin to be the sealant 40 is restricted from leaking from the case 10 and dripping onto the case 10, while the amount of expanded air may not be reduced.

Figure 5:
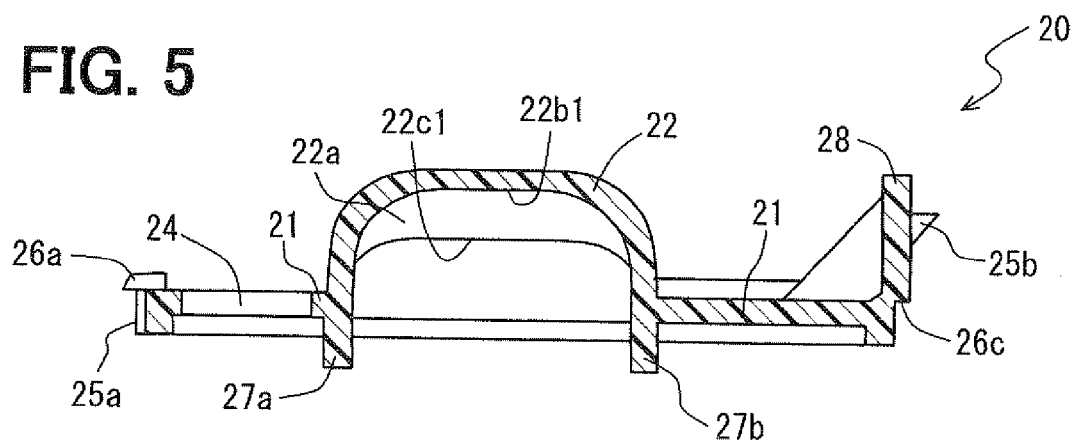
FIG. 5 is a cross-sectional view taken along line V-V of FIG. 4.

As shown in FIG. 5 and FIG. 6, a periphery of the cover 20 has a flange 26a, 26b, 26c, 26d corresponding to the step 116 of the case 10. Further, the cover 20 has a fix part to be fixed to the case 10. The fix part may be a fitting 25a shown in FIG. 4 and an engaging hook 25b shown in FIG. 5. The fitting 25a protrudes outward from a side face of the cover 20 corresponding to the side wall 114 of the case 10. The engaging hook 25b protrudes outward from a wall 28 of the cover 20 corresponding to the side wall 113 of the case 10.

When the cover 20 is fixed to the case 10, an inner face of the cover 20 opposes to the electronic circuit 30. As shown in FIG. 2, an end portion of the recess part 22 has a wall 27a, 27b protruding toward the bottom face 117 of the case 10. The wall 27a, 27b has a width approximately equal to a width of the recess part 22, and a height disable to contact the electronic circuit 30. The position of the wall 27a is not limited to the end portion of the recess part 22. The wall 27a may be located at least between the filling port 24 and the recess part 22. That is, the wall 27a may be located in an area between the filling port 24 and the end portion of the recess part 22 adjacent to the filling port 24.

Further, the position of the wall 27b is not limited to the end portion of the recess part 22. The wall 27b may be located at least between the air vent hole 23 and the recess part 22. That is, the wall 27b may be located in an area between the air vent hole 23 and the end portion of the recess part 22 adjacent to the air vent hole 23. If the cover 20 does not have the air vent hole 23, the cover 20 may have only the wall 27a adjacent to the filling port 24.

Crack may be generated in the sealant 40 adjacent to the filling port 24 or the air vent hole 23, because the sealant 40 may deteriorate with time. If the crack is generated in the sealant 40, water may enter the electronic circuit 30 through the crack. The entering of water is required to be restricted relative to the recess part 22 not sealed by the sealant 40.

Due to the wall 27a, 27b, even if the crack is generated in the sealant 40, a distance between the crack adjacent to the filling port 24 or the air vent hole 23 and the recess part 22 can be made long. Therefore, if the sealant 40 deteriorates and has the crack, water is restricted from reaching the recess part 22 of the electronic circuit 30.

A method of assembling the ultrasonic sensor 100 will be described.

The electronic circuit 30 is disposed in the case 10. The cover 20 is filled and fixed to the opening of the case 10. When the cover 20 is fixed to the case 10, the engaging hook 25b shown in FIG. 5 is inserted into the engaging opening 115 shown in FIG. 3, and the cover 20 is pressed toward the bottom face 117. Thus, the fitting 25a is pressed onto the side wall 114 of the case 10, as shown in FIG. 2. At this time, the cover 20 is restricted from falling into the case 10, because the flange 26a, 26b, 26c, 26d of the cover 20 contacts the step 116 of the case 10. Further, the cover 20 closes the opening of the case 10, such that a top face of the cover 20 is located equal to or lower than the end face 111a, 112a, 111b, 112b, 113a, 114a of the side wall 111, 112, 113, 114 of the case 10.

As shown in FIG. 2, the liquid resin to be the sealant 40 is filled in a space for the electronic circuit 30 constructed with the case 10 and the cover 20 through the filling port 24 by using a filling machine such as dispenser, for example. The liquid resin may be urethane resin, for example. As shown in FIG. 2, a space defined by the main portion 11 and the flat part 21 of the cover 20 is filled with the liquid resin. That is, a liquid level LL of the sealant 40 is approximately equal to a top face of the flat part 21. Alternatively, the sealant 40 may overflow from the filling port 24 so as not to drip onto a side face of the case 10, in a case that the end face 111a, 112a, 111b, 112b, 113a, 114a are located sufficiently higher than the cover 20, as shown in FIG. 1.

When the filling of the liquid resin is finished, the liquid resin is heated to be hardened for ten minutes at temperature of 80° C., for example. The hardened liquid resin is to be the sealant 40. Immediately after the heating and the hardening are started, viscosity decreasing in accordance with polymer plasticization is larger than viscosity increasing in accordance with polymer linkage. Thus, viscosity of the liquid resin is temporally decreased, compared with the liquid resin at the filling time.

In a case that each of the case 10 and the cover 20 is molded by using the mold having plural molding patterns, adjustments of the mold and the molding condition become difficult, because tightly contact state is needed between the case 10 and the cover 20 so as to restrict the leakage of the liquid resin. Thus, producing process management may become complicated.

However, according to the embodiment, the cover 20 is located inside of the side wall 111, 112, 113, 114 so as to close the opening of the case 10. The top face of the cover 20 is located to be equal to the end face 111a, 112a, 111b, 112b, 113a, 114a of the side wall 111, 112, 113, 114 of the case 10, or is located adjacent to the bottom face 117 relative to the end face 111a, 112a, 111b, 112b, 113a, 114a of the side wall 111, 112, 113, 114 of the case 10.

Therefore, the sealant 40 can be restricted from leaking through a clearance between the case 10 and the cover 20, and can be restricted from dripping onto the outer wall of the case 10 or the cover 20, if the sealant 40 is in a low-viscosity state.

What is claimed is:

1. An electronic circuit device comprising:
   a case and a cover between which a space is defined;
   a plurality of electronic circuit parts arranged in the space; and
   a sealant to seal the plurality of electronic circuit parts, wherein
   the case has a bottom face, a side wall, and an opening face opposing to the bottom face,
   the cover is located inside of the side wall so as to close the opening face of the case,
   the cover has a filling port through which the sealant is filled, and
   the cover has a top face located to be approximately equal to an end face of the side wall or adjacent to the bottom face relative to the end face of the side wall.

2. The electronic circuit device according to claim 1, wherein
   the cover further has an air vent hole for releasing air out of the space defined by the case and the cover.

3. The electronic circuit device according to claim 1, wherein
   the cover has a flat part and a recess part recessed from the flat part in a direction separating from the electronic circuit parts.

4. The electronic circuit device according to claim 3, wherein
   the cover has an inner face and a wall protruding from the inner face toward the bottom face, and
   the wall is located between the filling port and the recess part.

5. The electronic circuit device according to claim 3, wherein
   the recess part has a recess dimension corresponding to heights of the electronic circuit parts.

6. The electronic circuit device according to claim 1, wherein
   the electronic circuit parts are circuits to control an ultrasonic sensor for a vehicle to detect an obstacle around the vehicle.

7. The electronic circuit device according to claim 3, wherein
   the recess part and the sealant define a space filled with air, and
   a part of the electronic circuit parts is exposed in the space.

8. The electronic circuit device according to claim 3, wherein
   the sealant has a liquid level approximately equal to a top face of the flat part of the cover.

* * * * *